(12) United States Patent
Paietta et al.

(10) Patent No.: US 12,723,570 B2
(45) **Date of Patent: *Sep. 1, 2026**

(54) METHOD AND SYSTEM FOR PERFORMING CONDITION MONITORING OF WIND TURBINE COMPONENTS

(71) Applicant: Fischer Block, Inc., West Chester, PA (US)

(72) Inventors: Margaret Paietta, Royersford, PA (US); Gregory Wolfe, Royersford, PA (US)

(73) Assignee: Fischer Block, Inc., West Chester, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/363,828

(22) Filed: Aug. 2, 2023

(65) Prior Publication Data

US 2024/0018940 A1 Jan. 18, 2024

Related U.S. Application Data

(63) Continuation of application No. 17/437,516, filed as application No. PCT/US2021/018449 on Feb. 18, 2021, now Pat. No. 11,808,248.

(Continued)

(51) Int. Cl.
*F03D 17/00* (2016.01)
*G01R 31/34* (2020.01)

(52) U.S. Cl.
CPC ........... *F03D 17/00* (2016.05); *G01R 31/343* (2013.01)

(58) Field of Classification Search
CPC ........ G01R 31/343; F03D 17/00; Y02E 10/72

(Continued)

(56) References Cited

U.S. PATENT DOCUMENTS

| | | | |
|---|---|---|---|
| 5,519,337 | A | 5/1996 | Casada |
| 10,768,072 | B2 | 9/2020 | Bechhoefer et al. |

(Continued)

FOREIGN PATENT DOCUMENTS

| | | | |
|---|---|---|---|
| CN | 111582392 | B | 3/2021 |
| EP | 1 043 066 | A1 | 7/2016 |

(Continued)

OTHER PUBLICATIONS

International Search Report and Written Opinion for related International Patent Application No. PCT/US2021/018449, dated Jun. 14, 2021, 13 pages.

(Continued)

*Primary Examiner* — John H Le
(74) *Attorney, Agent, or Firm* — Morgan, Lewis & Bockius LLP

(57) ABSTRACT

A technique for performing condition monitoring of a plurality of components of a plurality of wind turbines is disclosed. The technique includes, for each of the plurality of wind turbines, measuring at least one time-series electrical output signal of the wind turbine generator, each time-series electrical output signal representing an aggregate of a plurality of subset signals. Such condition monitoring further includes mathematically extracting one or more such subset signals from the at least one time-series electrical output signal of the generator, and associating one or more such subset signals with one or more wind turbine components. A fault threshold value for each such one or more subset signals may be determined, and the one or more such subset signals are compared to such fault threshold value. Based on such association and comparison, the condition of such a wind turbine component of the plurality of wind turbines is determined.

6 Claims, 9 Drawing Sheets

Related U.S. Application Data

(60) Provisional application No. 62/978,043, filed on Feb. 18, 2020.

(58) Field of Classification Search
USPC .......................................................... 702/58
See application file for complete search history.

(56) References Cited

U.S. PATENT DOCUMENTS

| | | | | |
|---|---|---|---|---|
| 11,808,248 | B2 * | 11/2023 | Paietta | F03D 17/005 |
| 2013/0049733 | A1 | 2/2013 | Neti et al. | |
| 2013/0261988 | A1 | 10/2013 | Lim et al. | |
| 2014/0163904 | A1 | 6/2014 | Bechhoefer et al. | |
| 2017/0104346 | A1 | 4/2017 | Wenzel et al. | |

FOREIGN PATENT DOCUMENTS

| | | | |
|---|---|---|---|
| EP | 3043066 | A1 | 7/2016 |
| JP | 2009 243428 | A | 10/2009 |

OTHER PUBLICATIONS

International Preliminary Report on Patentability for related International Patent Application No. PCT/US2021/018449, dated Aug. 23, 2022, 12 pages.
European Patent Office Communication issued Mar. 26, 2025, in connection with European Patent Application No. 21756719.7, 7 pages.

* cited by examiner

600

WIND TURBINE OF INTEREST: T4
HISTORICAL REFERENCE: TURBINE T4
SUBSET SIGNAL: 6.4 HERTZ

| | PERCENTAGE OF TOTAL OUTPUT CURRENT | | | | PERCENTAGE OF TOTAL OUTPUT CURRENT | | | |
|---|---|---|---|---|---|---|---|---|
| TOTAL OUTPUT CURRENT BAND (AMPS) | HISTORICAL MEAN (TURBINE: T4) | HISTORICAL STANDARD DEVIATION (TURBINE: T4) | FAULT THRESHOLD LEVEL | ACCEPTABLE # OF STANDARD DEVIATIONS FROM MEAN | MEASUREMENT OF INTEREST (TURBINE: T4) | # OF STANDARD DEVIATIONS FROM HISTORICAL MEAN | EXCEEDS FAULT THRESHOLD (YES OR NO?) | HEALTH CONDITION INDEX (FAULT SEVERITY) |
| A | B | C | D = B + CD | E ( > 0) | F | G: (F - B) / C | H: YES IF (G > E) | I: G / E |
| 0-10 | 1.800 | 0.360 | 2.88 | 3.00 | 1.980 | 0.500 | | 0.167 |
| 10-30 | 1.300 | 0.260 | 2.21 | 3.50 | 1.350 | 0.192 | | 0.055 |
| 30-50 | 1.100 | 0.220 | 1.87 | 3.50 | 1.408 | 1.400 | | 0.400 |
| 50-70 | 1.000 | 0.200 | 1.80 | 4.00 | 1.250 | 1.250 | | 0.313 |
| 70-90 | 0.900 | 0.180 | 1.44 | 3.00 | 0.702 | 1.100 | | 0.367 |
| 90-110 | 0.800 | 0.160 | 1.28 | 3.00 | 1.032 | 1.450 | | 0.483 |
| 110-130 | 0.700 | 0.140 | 1.12 | 3.00 | 0.735 | 0.250 | | 0.083 |
| 130-150 | 0.600 | 0.120 | 1.02 | 3.50 | 0.570 | 0.250 | | 0.071 |
| 150-170 | 0.500 | 0.100 | 0.90 | 4.00 | 0.445 | 0.550 | | 0.138 |
| 170-190 | 0.350 | 0.070 | 0.61 | 3.75 | 0.411 | 0.875 | | 0.233 |
| 190-210 | 0.220 | 0.110 | 0.66 | 4.00 | 1.300 | 9.818 | YES | 2.455 |
| 210-230 | 0.150 | 0.030 | 0.24 | 3.00 | 0.108 | 1.400 | | 0.467 |
| 230-250 | 0.125 | 0.100 | 0.43 | 3.00 | 0.250 | 1.250 | | 0.417 |
| 250-270 | 0.100 | 0.020 | 0.17 | 3.50 | 0.114 | 0.700 | | 0.200 |

WIND TURBINE OF INTEREST: T4
HISTORICAL REFERENCE: ENTIRE WINDFARM
SUBSET SIGNAL: 6.4 HERTZ

| | PERCENTAGE OF TOTAL OUTPUT CURRENT | | | | PERCENTAGE OF TOTAL OUTPUT CURRENT | | | |
|---|---|---|---|---|---|---|---|---|
| TOTAL OUTPUT CURRENT BAND (AMPS) | HISTORICAL MEAN (ENTIRE WINDFARM) | HISTORICAL STANDARD DEVIATION (ENTIRE WINDFARM) | FAULT THRESHOLD LEVEL | ACCEPTABLE # OF STANDARD DEVIATIONS FROM MEAN | MEASUREMENT OF INTEREST (TURBINE: T4) | # OF STANDARD DEVIATIONS FROM HISTORICAL MEAN | EXCEEDS FAULT THRESHOLD (YES OR NO?) | HEALTH CONDITION INDEX (FAULT SEVERITY) |
| A | B | C | D = B + CD | E ( > 0) | F | G: (F - B) / C | H: YES IF (G > E) | I: G / E |
| 0-10 | 1.890 | 0.284 | 3.31 | 5.00 | 1.980 | 0.317 | | 0.063 |
| 10-30 | 1.235 | 0.185 | 2.12 | 4.80 | 1.350 | 0.621 | | 0.129 |
| 30-50 | 1.133 | 0.170 | 1.91 | 4.60 | 1.408 | 1.618 | | 0.352 |
| 50-70 | 0.970 | 0.146 | 1.61 | 4.40 | 1.250 | 1.924 | | 0.437 |
| 70-90 | 0.945 | 0.142 | 1.44 | 3.50 | 0.702 | 1.714 | | 0.490 |
| 90-110 | 0.760 | 0.114 | 1.10 | 3.00 | 1.032 | 2.386 | | 0.795 |
| 110-130 | 0.721 | 0.108 | 1.05 | 3.00 | 0.735 | 0.129 | | 0.043 |
| 130-150 | 0.582 | 0.087 | 0.89 | 3.50 | 0.570 | 0.137 | | 0.039 |
| 150-170 | 0.525 | 0.079 | 0.76 | 3.00 | 0.445 | 1.016 | | 0.339 |
| 170-190 | 0.333 | 0.050 | 0.51 | 3.50 | 0.411 | 1.579 | | 0.451 |
| 190-210 | 0.250 | 0.200 | 0.85 | 3.00 | 1.300 | 5.250 | YES | 1.750 |
| 210-230 | 0.150 | 0.030 | 0.24 | 3.00 | 0.108 | 1.400 | | 0.467 |
| 230-250 | 0.125 | 0.100 | 0.43 | 3.00 | 0.250 | 1.250 | | 0.417 |
| 250-270 | 0.100 | 0.020 | 0.16 | 3.00 | 0.114 | 0.700 | | 0.233 |

FIG. 6B

METHOD AND SYSTEM FOR PERFORMING CONDITION MONITORING OF WIND TURBINE COMPONENTS

CROSS-REFERENCE TO RELATED APPLICATIONS

The present application is a continuation of U.S. patent application Ser. No. 17/437,516 filed Sep. 9, 2021, now U.S. Pat. No. 11,808,248, which is a U.S. National Phase Entry of International Patent Application No. PCT/US2021/018449, filed Feb. 18, 2021, which claims priority from U.S. Provisional Application 62/978,043, filed Feb. 18, 2020, the entire contents of which are incorporated herein by reference.

FIELD OF THE INVENTION

The present disclosure relates to monitoring one or more conditions of a wind turbine. More particularly, the present disclosure relates to a technique in which the electrical output signal of the wind turbine generator is monitored to detect operational degradation of various components of the wind turbine, e.g. windings, shafts, and bearings, so that action can be taken to avoid wind turbine failure. The present disclosure further relates to a condition monitoring system for a wind turbine, to a wind turbine comprising a condition monitoring system, and to a wind farm.

BACKGROUND OF THE DISCLOSURE

Historically, assessing the health of one or more wind turbine components has consisted primarily of monitoring the physical vibration of various such components of a wind turbine. These techniques have several shortcomings as compared to the present disclosure. For example, such vibration monitoring systems are difficult to install requiring numerous physical sensors (e.g., vibration sensors), each required to be physically mounted in unique (separate) physical locations within the wind turbine. Further, each sensor may require individual wire connections from a central monitoring unit, whereby such vibration sensing modules and wires become safety trip hazards to technicians who commonly are required to work in, on, and around the various components of a wind turbine system.

Moreover, typical vibration monitoring methods and systems are, by design, only capable of detecting physical vibrations and thus, are unable to detect degradation in wind turbine components for those type of components which either do not vibrate or in which such component's vibration does not change with operational performance degradation, e.g., rotor bars and stationary windings. As such, wind turbine component monitoring methods which utilize mechanical vibration signal monitoring techniques are unable to detect many types of degradation of components within the electrical sub-systems of wind turbines.

SUMMARY

A system and method are provided for performing condition monitoring of a plurality of components of a plurality of wind turbines is disclosed. The disclosed techniques include, for each of the plurality of wind turbines, measuring at least one time-series electrical output signal of the wind turbine generator, each time-series electrical output signal representing an aggregate of a plurality of subset signals. Such condition monitoring further includes mathematically extracting one or more such subset signals from the at least one time-series electrical output signal of the generator, and associating one or more such subset signals with one or more wind turbine components. A fault threshold value for each such one or more subset signals may be determined, and the one or more such subset signals are compared to such fault threshold value. Based on such association and comparison, the condition of such a wind turbine component of the plurality of wind turbines is determined.

BRIEF DESCRIPTION OF FIGURES

FIG. 6A is, for one embodiment, a table showing, for a specific wind turbine, the relationship between a plurality of subset signals of interest, and their respective fault threshold values and health condition indexes, according to at least one embodiment.

FIG. 6B is, for one embodiment, a table showing, for a specific wind turbine, the relationship between a plurality of subset signals of interest, and their respective fault threshold values and health condition indexes, according to at least one embodiment.

DESCRIPTION OF THE DISCLOSURE

Figure 1:
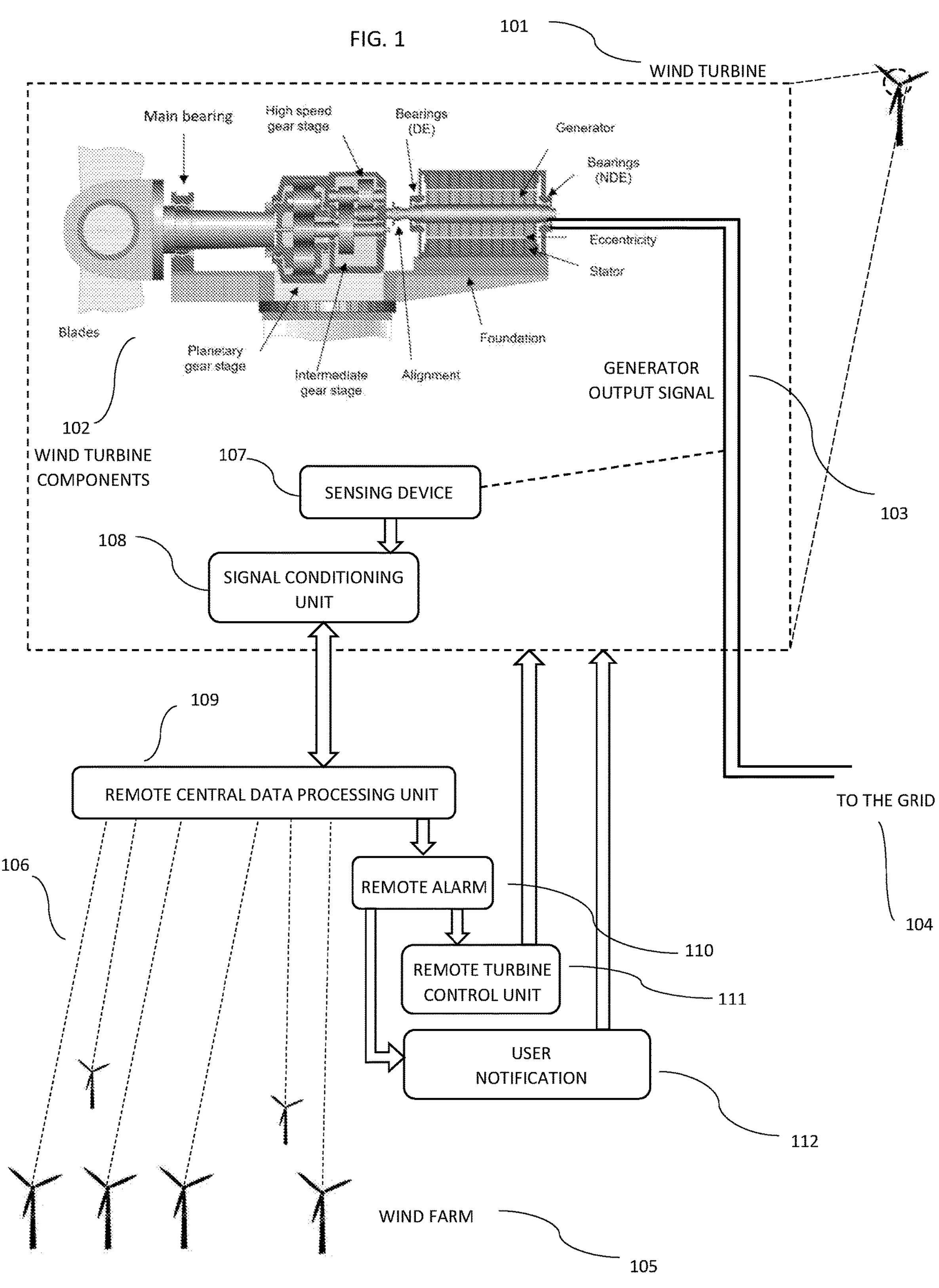
FIG. 1 is, according to one embodiment of the disclosure, a schematic diagram of a plurality of wind turbines such as on a wind farm in which condition monitoring is performed according to at least one embodiment.

It is an object of some embodiments of the disclosure to provide a method for performing condition monitoring on a plurality of wind turbines arranged in a wind farm, the method allowing faults or malfunction of one or more wind turbine components to be readily detected.

It is a further object of some embodiments of the disclosure to provide a method for performing condition monitoring on a plurality of wind turbines arranged in a wind farm, the method allowing effective use of a generator electrical output signal.

It is an even further object of some embodiments of the disclosure to provide a condition monitoring system for a wind turbine, the condition monitoring system being capable of readily detecting faults or malfunction of one or more wind turbine components.

According to a first aspect of the disclosure there is provided a method for performing condition monitoring of a plurality of components of a plurality of wind turbines, arranged in a wind farm. The method may include, for each of the plurality of wind turbines, measuring at least one time-series electrical output signal of the wind turbine generator, each time-series electrical output signal representing an aggregate of a plurality of subset signals. The method may further include mathematically extracting one or more such subset signals from the at least one time-series electrical output signal of the generator, associating one or more such subset signals with one or more wind turbine components, determining a fault threshold value for each such one or more subset signals, comparing the one or more such subset signals to such fault threshold value, and determining the condition of such at least one wind turbine component of the plurality of wind turbines based on such association and comparison.

In the present context, the term 'condition monitoring of a wind turbine' may refer to a process in which the health condition of the wind turbine and/or of one or more components of the wind turbine is monitored. For instance, it may be monitored whether or not a given wind turbine component is operating as it is supposed to, i.e. whether or not a given wind turbine component is failing, faulty, malfunctioning and/or operating in a non-optimal manner. Monitored wind turbine components may include components within both the mechanical and electrical sub-systems within the wind turbine, e.g. bearings and stationary windings. In the present context, the term 'wind farm' may refer to two or more wind turbines arranged at a wind turbine site.

In the present context, the term 'measuring a time-series electrical output signal of a wind turbine generator' may refer to a process in which the electrical output signal is sampled several times during at least one frequency cycle, with substantially equal time intervals between successive samples, i.e., at a given sample rate. Accordingly, a plurality of sampled values are created such that the number of subset signals mathematically extracted from such time-series sampled values, and the frequency resolution of each such subset signal, can both be derived on the basis of the rate at which such values are sampled and the number of values sampled. For instance, the number of subset signals mathematically extracted from a time-series electrical output signal of a wind turbine generator and the frequency resolution of each such subset signal may be calculated using formulas of the form:

$$\#SS_{signals}=N/2$$

$$F\{SS_{resolution}\}=SR/N,$$

where $\#SS_{signals}$ is equal to the number of extracted subset signals, N is equal to the number of values sampled, $F\{SS_{resolution}\}$ is equal to the frequency resolution of each subset signal, and SR is equal to the rate at which values are sampled. The step of mathematically extracting one or more subset signals from a time-series electrical output signal may include performing one or more frequency transforms on the time-series electrical output signal of the wind turbine generator. As such the subset signals may be iteratively deconstructed from the such time-series electrical output signal in such a fashion in which, when mathematically added together, such added subset signals substantially reconstruct the such time-series electrical output signal.

The step of associating one or more subset signals with one or more wind turbine components may include calculating at least one of a product and a ratio between:

- a frequency of a subset signal and the frequency of the time-series electrical signal output of the generator,
- a frequency of a first subset signal with the frequency of a second subset signal,
- a frequency of a subset signal and a frequency of a rotating element within the wind turbine,
- a frequency of a first subset signal and a frequency of a second subset signal,
- a frequency of a subset signal and the number of pole pairs within the generator of the wind turbine,
- a frequency of a subset signal and the number of rotor bars within the generator of the wind turbine,
- a frequency of a subset signal and the number of stator winding slots within the generator of the wind turbine,
- a frequency of a subset signal and the number of rolling elements within a bearing case within the generator of the wind turbine,
- the number of teeth on a first gear and with the number of teeth on a second gear within the wind turbine, and
- a frequency of a subset signal and the physical motion of one or more moving elements within the drivetrain.

For instance, associating one or more subset signals with one or more wind turbine rotor bars may be calculated using a formula of the form:

$$F\{SS_{rotor\ bar}\}=F_{output}\pm 2(F_{output}-F\{SS_{rs}\}\#pp),$$

wherein $F\{SS_{rotor\ bar}\}$ is the frequency of the subset signal calculated to be associated with one or more rotor bars within the wind turbine, $F_{output}$ is the frequency of the time series electrical output signal to the grid, as generated by the wind turbine, $F\{SS_{rs}\}$ is the frequency of the subset signal associated with the rotational speed of the rotor cage within the wind turbine generator, and #pp is the number of pole-pairs within the generator. A subset signal associated with one or more wind turbine rotor bars may comprise of at least one frequency sideband near the wind turbine output frequency, the difference of which is determined by the speed of the rotor cage multiplied by the number of pole-pairs in the generator.

According to one embodiment of the disclosure, at least one generator output electrical signal is initially measured for each of the wind turbines of the wind farm. Each generator output electrical signal may be comprised of an aggregate of subset signals, each of which is associated with one or more monitored components of the wind turbine. As described above, generator electrical output signals contain useful information regarding the health condition of wind turbine components in both the mechanical and electrical wind turbine sub-systems, and accordingly such signals are very suitable for condition monitoring purposes. The generator electrical output signal may be measured with one or more sensors operationally coupled to one or more generator electrical output signals.

A given generator electrical output signal may contain an aggregate of subset signals whereby one or more such subset signals may represent the operational performance of a single monitored component. As an alternative, a given subset signal may represent the operational performance of two or more different components which may be mechanically or electrically related or operationally coupled to each other.

Similarly, operational performance of a given monitored component may be represented by only a single subset signal. Alternatively, operational performance of a given monitored component may be represented by a combination of two or more subset signals.

Next, a plurality of health condition indexes may be generated. Each health condition index corresponding to one or more monitored components, i.e., a health condition index may be generated for each of the monitored components. Health condition indexes may be generated on the basis of one or more of the subset signals, preferably on the basis of the subset signal(s) which represent(s) the monitored component in question.

The step of comparing the subset signal to its fault threshold level may include calculating a health condition index, whereby such calculation may include calculating the ratio between the value of the subset signal and the value of the threshold fault level assigned to such subset signal. For instance, calculating a health condition index for one or more wind turbine components may be calculated using a formula of the form:

$$HCI_n=((V\{SS_n\}-HM\{SS_n\})/HSTD\{SS_n\})/((FTL\{SS_n\}-HM\{SS_n\})/HSTD\{SS_n\}),$$

where $HCI_n$ is the health condition index for a given, ie., $n^{th}$ subset signal corresponding to one or more wind turbine components, $V\{SS_n\}$ is equal to the value of the $n^{th}$ subset signal, $HM\{SS_n\}$ is the mean of the historical values of the $n^{th}$ subset signal, $HSTD\{SS_n\}$ is the standard deviation of the historical values of the $n^{th}$ subset signa, and $FTL\{SS_n\}$ is the fault threshold level of the $n^{th}$ subset signal. When the $HCI_n$, exceeds a predetermined acceptable level, alarm notifications may be initiated so that wind turbine control actions and/or preventative action may be taken in order to reduce the value of $V\{SS_n\}$, and hence $HCI_n$ as observed during subsequent executions of the method. In summary, each of the generated health condition indexes provides a good indication of the health condition of a given component of a given wind turbine of the wind farm, since it represents the operational performance level of said component.

In one embodiment, the health condition indexes, originating from the same wind turbine over various historical time periods, are compared, and the condition of each of the monitored components of the given wind turbine is evaluated, based on the comparison. Since the comparisons can take place over a historically long period of time, a vast amount of data is available, thereby improving the accuracy of the evaluation. Furthermore, this makes it very easy to detect a wind turbine which begins to behave differently from its historical norm. This is an advantage because this may very well be an indication that this wind turbine, or one or more components of this wind turbine, is failing or operating in a non-optimal manner.

In another embodiment the health condition indexes originating from different wind turbines of the wind farm are compared, and the condition of each of the monitored components of the plurality of wind turbines is evaluated, based on the comparison. Since the comparison takes place at wind farm level, i.e. health condition indexes originating from different wind turbines are compared, a vast amount of data is also available, thereby improving the accuracy of the evaluation. Furthermore, this makes it very easy to detect a wind turbine which behaves differently from the other wind turbines of the wind farm. This is an advantage because this may very well be an indication that this wind turbine, or one or more components of this wind turbine, is failing or operating in a non-optimal manner.

In one embodiment, the method may further comprises the steps of grouping the generated health condition indexes according to wind farm and/or according to turbine type, and/or according to turbine and/or according to monitored component and/or according to monitored components with related functions within the wind turbine and/or according to total electrical generator output level of the wind turbine generator at the time of measurement, and displaying the grouped health condition indexes accordingly. Such grouping and displaying of the generated health condition indexes makes it very easy to compare the health condition indexes on a wind turbine and/or wind farm level, and to detect any deviations which may indicate that a wind turbine, or a component of a wind turbine, is faulty or failing or, according to its performance as measured over time, i.e., trendline, will ultimately fail if preventative action is not taken prior to its failure.

In one embodiment, the method may further comprise the steps of outputting an alert when one or more health condition indexes exceeds a fault threshold value. Such alert output may be comprised of either a control signal or a notification to a user. In such a case, a control signal may be used to modify or alter the wind turbines operating conditions so as to favorably reduce the severity of one or more measured subset signals below the corresponding fault threshold level or levels. An output alert in the form of a user notification may be used to cause a user to make a repair or inspection on the identified wind turbine component if, as in one embodiment, the control adjustments were unable to reduce the severity of a subset signal into a region below a fault threshold level.

According to a second aspect, the disclosure provides a condition monitoring system for a wind turbine, the condition monitoring system being configured to perform the operations described according to various embodiments provided in the present disclosure. Thus, the condition monitoring system is capable of detecting faults or failures in wind turbine components in an easy and reliable manner.

According to a third aspect, the disclosure provides a wind turbine comprising a condition monitoring system according to the second aspect of the disclosure.

According to a fourth aspect, the disclosure provides a wind farm comprising a plurality of wind turbines, at least one of the wind turbines being a wind turbine according to the third aspect of the disclosure.

Referring to FIG. 1, wind farm 105 comprising a plurality of wind turbines 101, seven of which are shown. Each wind turbine 101 is equipped with a sensing device 107 arranged near the generator output 103, going out to the grid 104, which it is desired to monitor.

For each of the wind turbines, the sensing device 107 communicates measured signals to a signal processing unit 108. The signal processing unit 108 processes and forwards 106 the processed signals to a remote central data processing unit 109 which is located remotely with respect to the individual wind turbine 101 and centrally within a population of wind turbines such as a wind farm 105. The remote central data processing unit 109 is capable of determining whether or not any of the monitored components 102 of a wind turbines 101 are operating as they are supposed to. For example, such operational determination may include further processing and comparing the processed signals to historical processed signals on one or both of an individual wind turbine basis and on wind turbine population basis such as a wind farm. This comparison may be used to generate a health condition index each such one or more wind turbine components 102.

In the case that it is determined that a given component 102 is faulty or failing, the central processing unit 108 generates a remote alarm 110 which can be used to either automatically adjust the operating conditions of the wind turbine 2 via remote turbine control unit 111. Alternatively or additionally, the central processing unit 108 may notifies users, via user notification 112, that a component 102 is faulty or failing so that appropriate action can be taken to avoid further component degradation. Such action may include inspection or repair of said faulty or failing component or may lead to further adjustment of the operating conditions of the wind turbine to extend the life of such faulty or failing component.

The central data processing unit 109 may, e.g., group the generated health condition indexes according to wind farm 105 and/or according to turbine type, and/or according to turbine 101 and/or according to monitored component and/or according to monitored components with related functions within the wind turbine and/or according to total electrical generator output level of the wind turbine generator at the time of measurement. The central data processing unit 109 may display the grouped health condition indexes accordingly so that components exhibiting the most severe degradation in health are easily seen by users of the disclosure.

Figure 2A:
FIG. 2A is a graph of a continuous time-series signal representing an electrical output to the grid according to at least one embodiment.
Figure 2A:
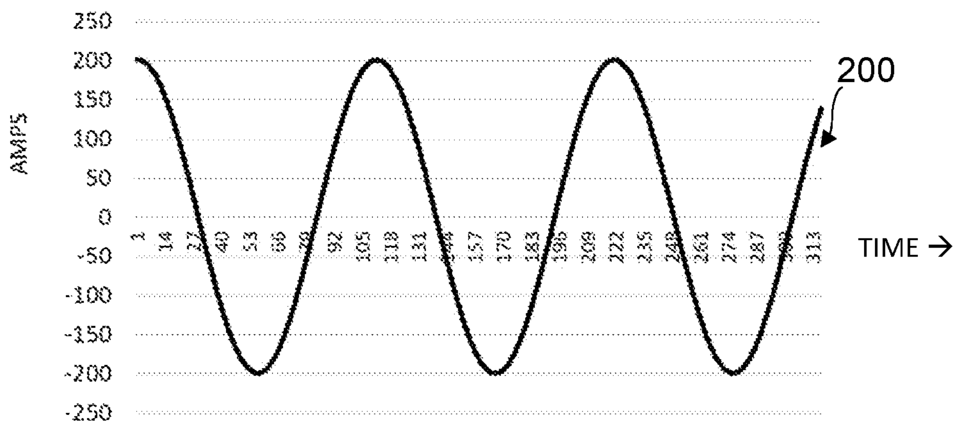

Referring to FIG. 2A, a graph 200 shows a continuous time-series signal, in the shape of a perfect sine-wave. The signal represents an electrical output to the grid as would be generated by a perfectly healthy wind turbine void of any anomalous conditions and/or degrading components within the wind turbine according to at least one embodiment.

Figure 2B:
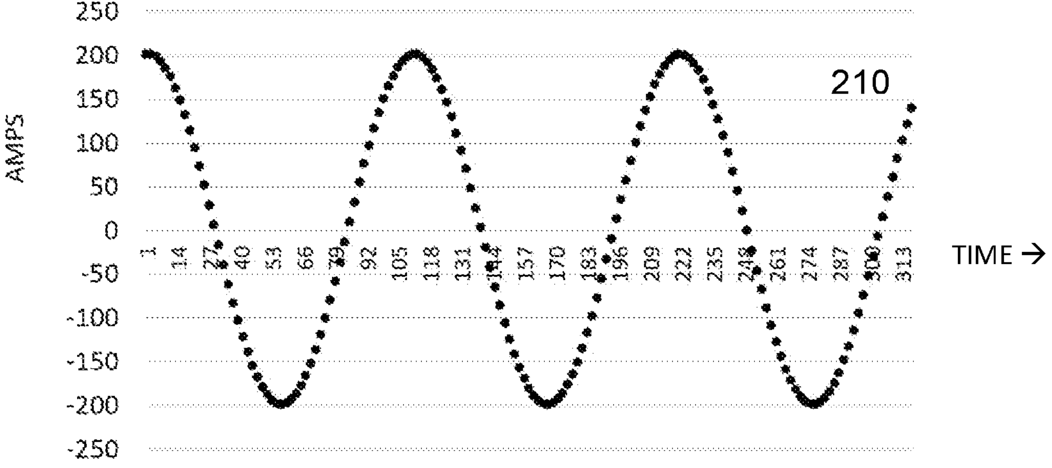
FIG. 2B shows the samples which are recorded at a specific sample rate for a specific number of samples taken from the continuous time-series signal shown in the graph of FIG. 2A according to at least one embodiment.
Figure 2C:
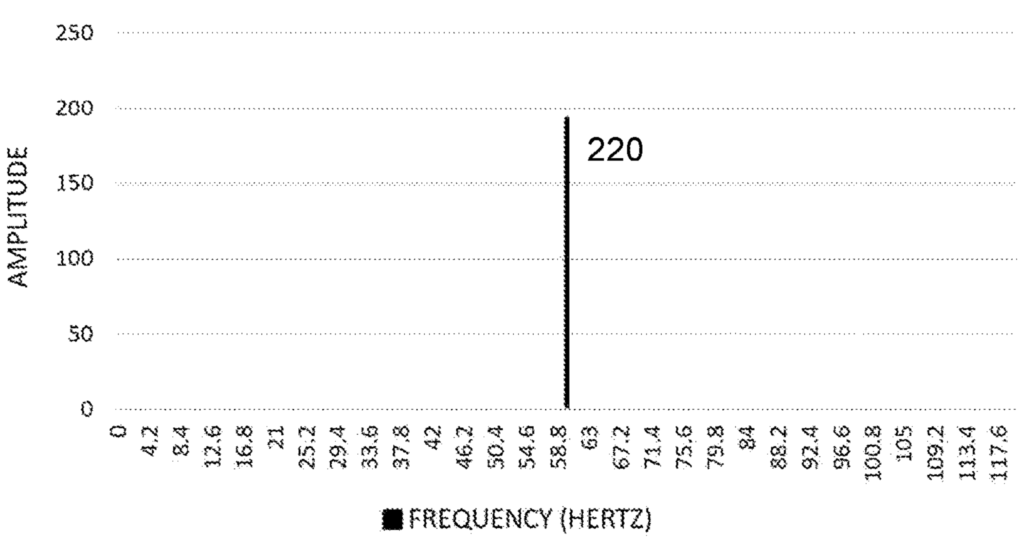
FIG. 2C is an amplitude plot showing the subset signals which are mathematically extracted from the samples FIG. 2B according to at least one embodiment.

FIG. 2B shows samples 210, which are recorded at a specific sample rate (SR) for a specific number of samples (N) taken from the continuous time-series signal shown in the graph 200 of FIG. 2A according to at least one embodiment. Relatedly, FIG. 2C shows an amplitude plot 220 illustrating the subset signals which are mathematically extracted from the samples FIG. 2B according to at least one embodiment. Note that a perfect sine-wave signal contains only one significant subset signal, whereby the amplitude and frequency of such significant subset signal are substantially equal to the amplitude and frequency of the sine-wave signal, respectively.

Figure 3A:
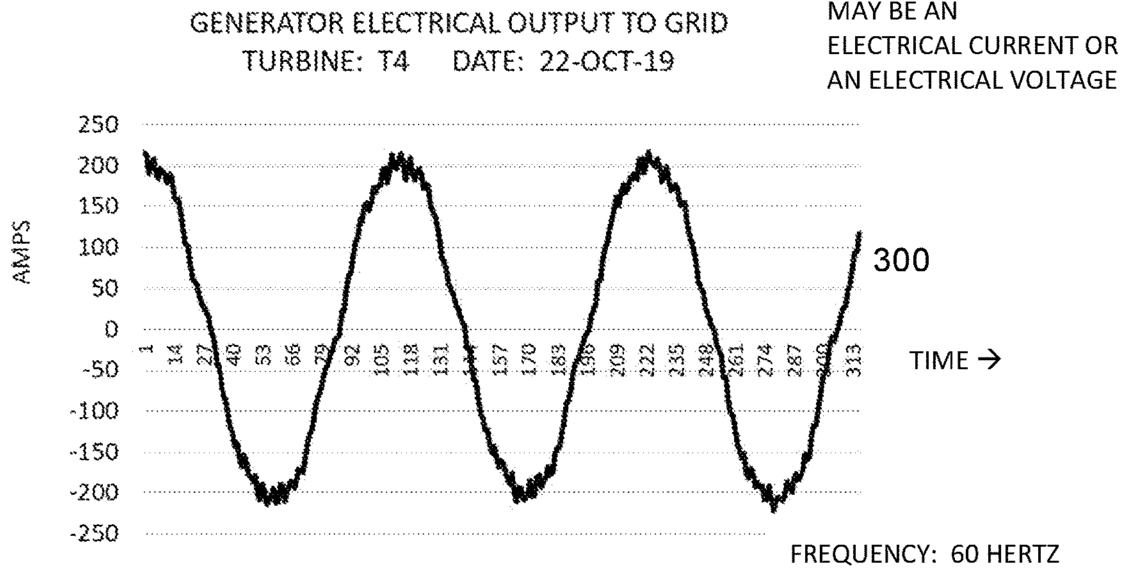
FIG. 3A is a graph of a continuous time-series electrical output to the grid according to at least one embodiment.

Referring to FIG. 3A, a graph 300 of a continuous time-series electrical output to the grid is illustrated. As shown, graph 300 is in the general shape of a sine-wave, with imperfections, as would be generated by a typical wind turbine on a specific date/time (T4, 22-Oct-19 as shown), which may contain anomalous conditions and/or degrading components within the wind turbine according to at least one embodiment.

Figure 3B:
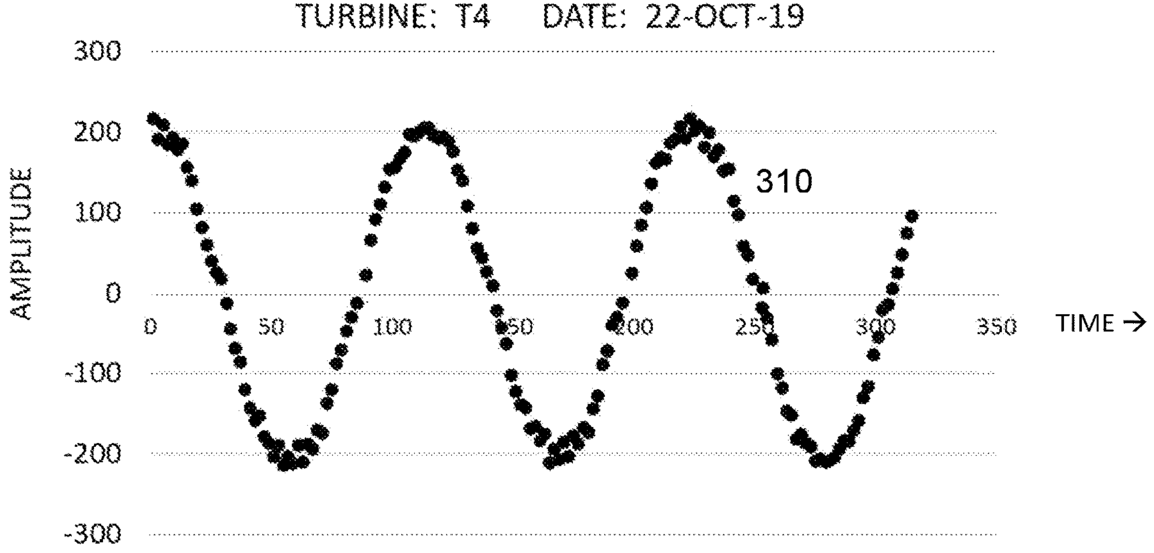
FIG. 3B shows the samples which are recorded at a specific sample rate for a specific number of samples taken from the continuous time-series electrical signal shown in the graph of FIG. 3A according to at least one embodiment.
Figure 3C:
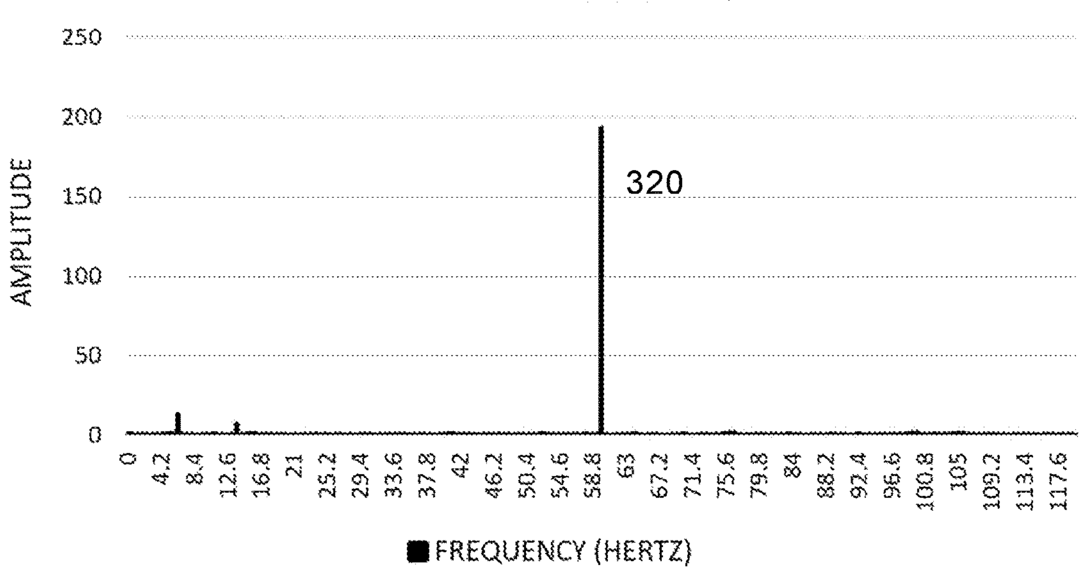
FIG. 3C is an amplitude plot showing the subset signals which are mathematically extracted from the samples of FIG. 3B according to at least one embodiment.
Figure 3D:
FIG. 3D is an amplitude percentage plot showing a relevant portion of subset signals of FIG. 3C according to at least one embodiment.
Figure 3D:
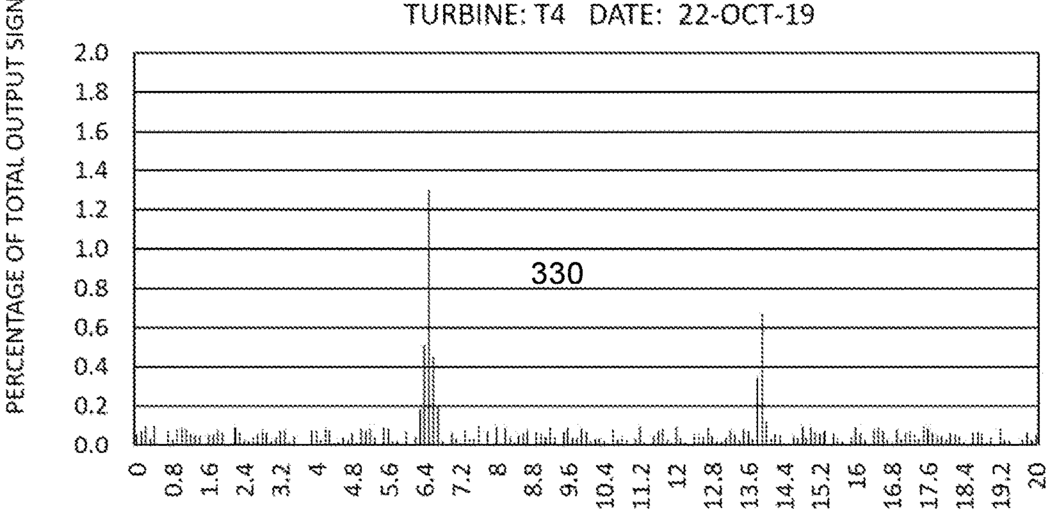

FIG. 3B shows samples 310, which are recorded at a specific sample rate (SR) for a specific number of samples (N) taken from the continuous time-series electrical signal shown in the graph 300 of FIG. 3A according to at least one embodiment. Relatedly, FIG. 3C shows an amplitude plot 320 illustrating the subset signals which are mathematically extracted from the samples of FIG. 3B according to at least one embodiment. Note that an imperfect sine-wave signal contains a plurality of subset signals, each at a specific and unique frequency, with varying amplitudes. Such plurality of subset signals, when each is mathematically converted back to the time domain, and added together, substantially recreate the time-series signal from which such plurality of subset samples were extracted. Further, FIG. 3D provides an amplitude percentage plot 330 showing a relevant portion of subset signals of FIG. 3C. Each such subset signal is shown as an amplitude percentage of the representative time-series electrical output signal from which such subset signal was generated according to at least one embodiment.

Figure 4A:
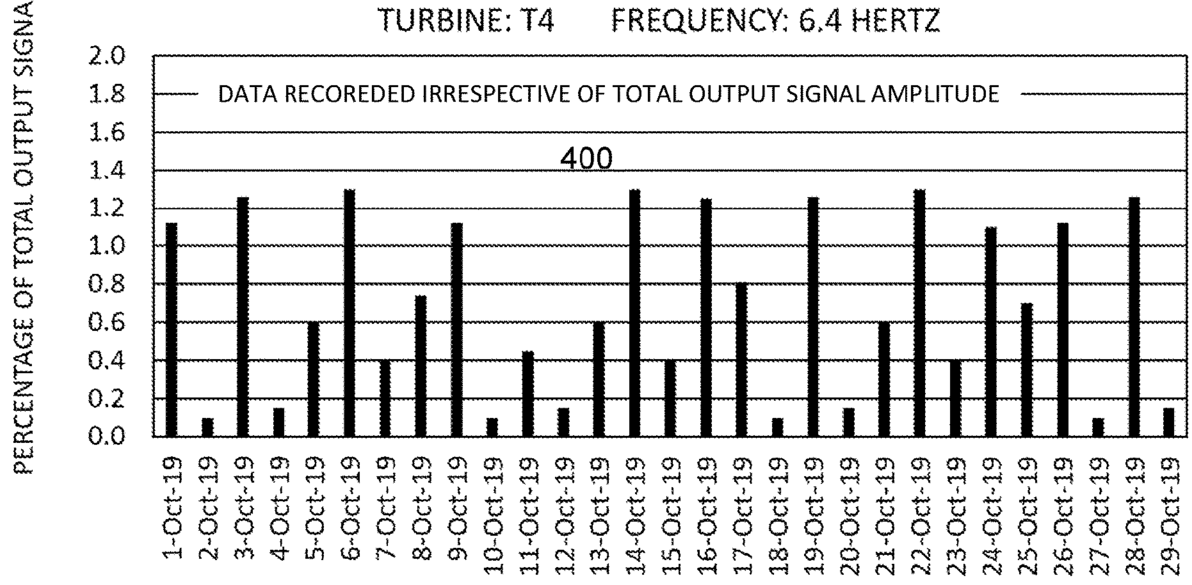
FIG. 4A is an amplitude percentage plot of historical values for a given subset signal according to at least one embodiment.
Figure 4B:
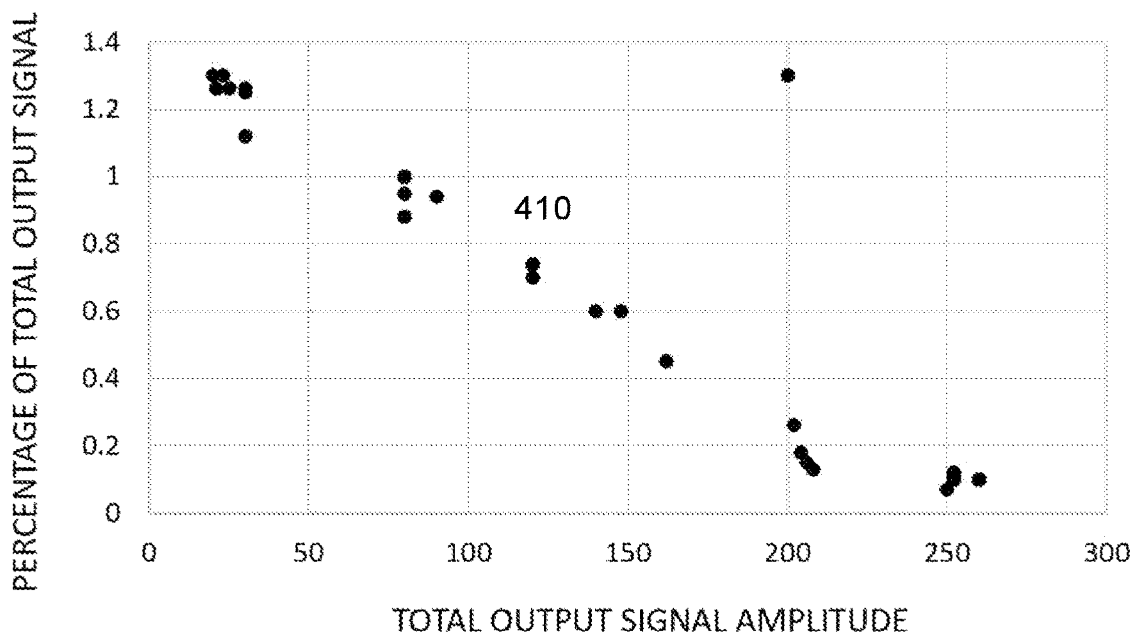
FIG. 4B is a relationship plot between those values of FIG. 4B and the respective amplitude levels of the representative time-series electrical output signal according to at least one embodiment.

Referring to FIG. 4A, an amplitude percentage plot 400 of historical values for a given subset signal (e.g., subset signal at 6.4 hertz) is shown. The subset signal is extracted from historical time-series electrical output signals for a given wind turbine according to at least one embodiment. FIG. 4B shows a relationship plot 410 between those values of FIG. 4B and the respective amplitude levels of the representative time-series electrical output signal from which such subset signals were generated according to at least one embodiment.

Figure 4C:
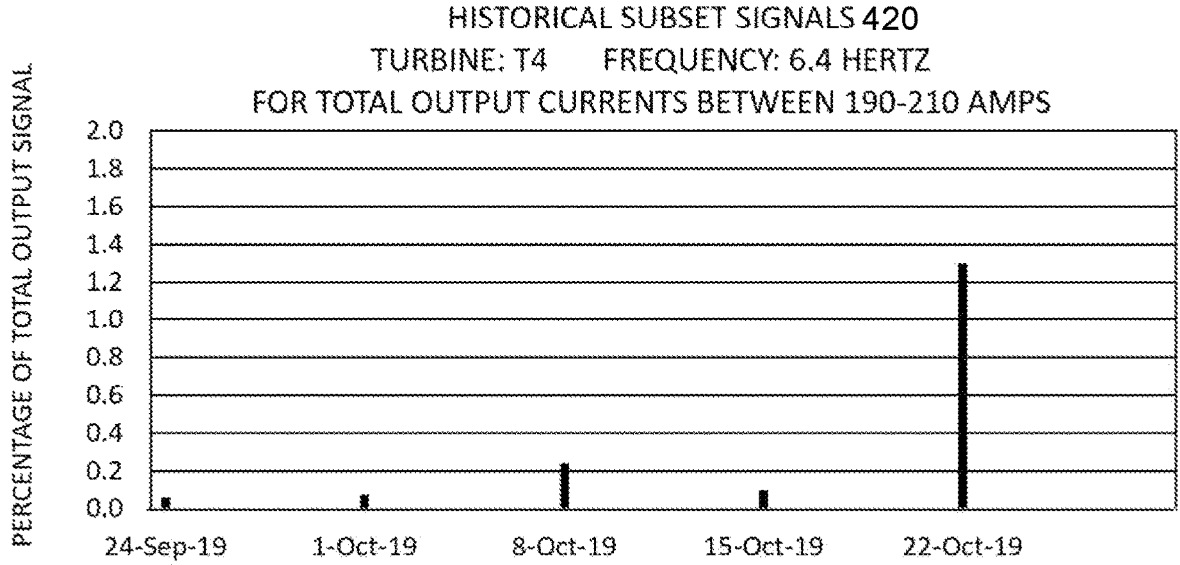
FIG. 4C is an amplitude percentage plot of historical values as shown in FIG. 4A according to at least one embodiment.

Further, FIG. 4C is an amplitude percentage plot 420 of historical values as shown in FIG. 4A, whereby such time-series electrical output signal is a current, and only those subset values recorded when such time-series electrical output signal was between 190-210 amps, are shown according to at least one embodiment.

Figure 5:
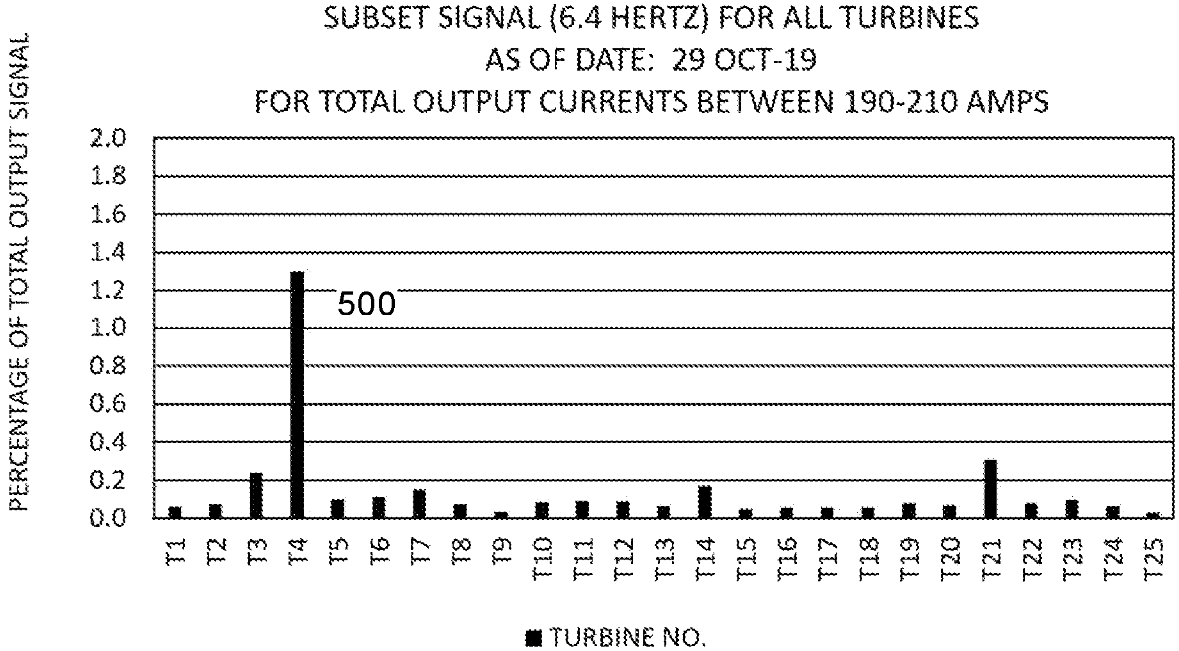
FIG. 5 is an amplitude percentage plot of a given subset signal according to at least one embodiment.

Referring to FIG. 5, an amplitude percentage plot 500 of a given subset signal (subset signal at 6.4 hertz) is shown. Each subset signal is recorded from one of a plurality of wind turbines at a given wind farm, whereby such time-series electrical output signal, from which such subset signals were extracted, was an electrical current, and only those subset values recorded when such time-series electrical output signal was between 190-210 amps, are shown according to at least one embodiment.

FIG. 6A is, for one embodiment, a table 600 showing, for a specific wind turbine, the relationship between a plurality of subset signals of interest, and their respective fault threshold values and health condition indexes, whereby such fault threshold values and health condition indexes are derived from the historical values taken from the such specific wind turbine according to at least one embodiment.

FIG. 6B is, for one embodiment, a table 650 showing, for a specific wind turbine, the relationship between a plurality of subset signals of interest, and their respective fault threshold values and health condition indexes, whereby such fault threshold values and health condition indexes are derived from the historical values taken from the population of wind turbines which such specific wind turbine is included according to at least one embodiment.

What is claimed is:

1. A method for performing condition monitoring of a plurality of components of a plurality of wind turbines, the method comprising:

for each of the plurality of wind turbines, measuring, using a sensing device, at least one time-series electrical output signal of a generator of the wind turbine, each time-series electrical output signal representing an aggregate of a plurality of subset signals;

sampling the at least one time series electrical output signal to generate sampled values, and extracting one or more such subset signals from the at least one time-series electrical output signal of the generator based on the sampled values;

associating one or more of the plurality of subset signals with one or more wind turbine components, wherein associating one or more subset signals with one or more wind turbine components includes calculating at least one of a product and a ratio between a frequency of a subset signal and a measure of physical motion of one or more moving elements within a drivetrain of the wind turbine;

comparing the one or more such subset signals to fault criteria, wherein the fault criteria comprises a fault threshold level and at least one mean historical value for each of the one or more such subset signals, wherein the comparing includes generating a first comparison value based on a first comparison of at least one of the one or more such subset signals to the at least one mean historical value, and a second comparison value based on a second comparison of the first value and the fault threshold level;

determining a condition of such at least one wind turbine component of the plurality of wind turbines based on the second comparison value including determining that the second comparison value meets the corresponding fault threshold level; and in response to determining that the second value meets the corresponding fault threshold level, outputting an alert comprising at least one of a control signal and a user notification.

2. The method according to claim 1 wherein the alert is the control signal, and wherein the control signal modifies at least one operating condition of the wind turbine to reduce the at least one time-series electrical output signal.

3. The method according to claim 1 wherein the alert is the user notification, and wherein the user notification is an alarm notification.

4. A condition monitoring system for a wind turbine, the condition monitoring system operationally coupled to a plurality of wind turbines in a wind farm, the condition monitoring system is configured to:

for each wind turbine of the plurality of wind turbines, measure, using a sensing device, at least one time-series electrical output signal of a generator of the wind turbine, each time-series electrical output signal representing an aggregate of a plurality of subset signals;

sample the at least one time-series electrical output signal to generate sampled values, and extract one or more such subset signals from the at least one time-series electrical output signal of the generator based on the sampled values;

associate one or more of the plurality of subset signals with one or more wind turbine components, wherein associating one or more subset signals with one or more wind turbine components, includes calculating at least one of a product and a ratio between a frequency of a subset signal and a measure of physical motion of one or more moving elements within a drivetrain of the wind turbine;

compare the one or more such subset signals to fault criteria, wherein the fault criteria comprises a fault threshold level and at least one mean historical value for each of the one or more such subset signals, wherein comparison includes a generation of a first comparison value based on a first comparison of at least one of the one or more such subset signals to the at least one mean historical value, and a second comparison value based on a second comparison of the first value and the fault threshold level;

determine a condition of such at least one wind turbine component of the plurality of wind turbines based on the second comp value including a determination that the second comparison value meets the corresponding fault threshold level; and in response to the determination that the second value meets the corresponding fault threshold level, output an alert comprising at least one of a control signal and a user notification.

5. The system according to claim 4 wherein the alert is the control signal, and wherein the control signal modifies at least one operating condition of the wind turbine to reduce the at least one time-series electrical output signal.

6. The system according to claim 4 wherein the alert is the user notification, and wherein the user notification is an alarm notification.

* * * * *